United States Patent [19]
Gambino et al.

[11] 3,959,799
[45] May 25, 1976

[54] INFORMATION STORAGE BY LASER BEAM INITIATED REACTIONS

[75] Inventors: Richard J. Gambino, Yorktown Heights; Frederic Holtzberg, Pound Ridge; Ralph R. Ruf, New City; Benjamin Welber, Chappaqua, all of N.Y.

[73] Assignee: International Business Machines Corporation, Armonk, N.Y.

[22] Filed: Sept. 9, 1974

[21] Appl. No.: 504,602

[52] U.S. Cl. .................. 346/135; 340/173 LM; 340/173 LS; 346/76 L
[51] Int. Cl.² ............................................ G01D 15/34
[58] Field of Search .................. 346/76 L, 135; 340/173 LM, 173 LS, 173 CH; 117/36.9; 427/53

[56] References Cited
UNITED STATES PATENTS

| | | |
|---|---|---|
| 3,368,209 | 2/1968 | McGlaucalin ................. 346/76 L X |
| 3,560,994 | 2/1971 | Wolff ................................. 346/135 |
| 3,594,167 | 7/1971 | Laming ........................... 350/3.5 X |
| 3,655,256 | 4/1972 | Claytor ............................ 346/76 X |
| 3,740,761 | 6/1973 | Fechter ............................ 346/135 |
| 3,831,179 | 8/1974 | Brill et al. ..................... 346/135 X |

*Primary Examiner*—Joseph W. Hartary
*Attorney, Agent, or Firm*—Hansel L. McGee

[57] ABSTRACT

There is disclosed herein a relatively low-cost, high density postable storage medium which comprises adjacent thin layers of two or more materials which react upon heating to form a reaction product with optical, magnetic or electrical properties different from the corresponding properties of the reactant materials. Thus, utilizing reactant layers such as aluminum and selenium, the heating results in a reaction product of $Al_2Se_3$. The heating agent is notably a laser beam.

1 Claim, 3 Drawing Figures

INFORMATION STORAGE BY LASER BEAM INITIATED REACTIONS

FIELD OF THE INVENTION

This invention relates to storage media, more particularly it relates to a novel high density, low threshold read only storage medium which is of relatively low cost.

Storage media are well known in which information can be stored by exposure to a focused laser beam. These media may be composed of an amorphous material which upon heating undergoes a transitional change to a crystalline material. Examples of such media are in U.S. Pat. No. 3,716,844 to Marc H. Brodsky and assigned to the same assignee as the present invention, and in U.S. Pat. No. 3,665,425. Other media may be composed of amorphous materials which soften upon the application of light and which resolidify upon removal of light, leaving voids in the exposed areas, as disclosed in U.S. Pat. No. 3,636,526. And yet other storage media are composed of easily vaporizable metals as in U.S. Pat. No. 3,560,994, materials which undergo color changes in presence of heat (U.S. Pat. No. 3,636,529) and materials which undergo ablation in presence of heat (U.S. Pat. No. 3,665,483).

The material used in the storage media mentioned above require high threshold temperatures to obtain the desired effect, i.e., change in optical density. Consequently, the rate of recording stored material is slow, or high energy sources for recording are needed.

SUMMARY OF THE INVENTION

It has been discovered here that read only storage media can be provided which consist of adjacent thin layers of two or more materials which react, upon heating, to form a reaction product different from those of the reactants. Information can be stored with a minimum energy, e.g., as low as $0.75$ nj/$\mu$m$^2$. The effect observed in white light is a great enhancement in reflectance and the appearance of a bluish spot in transmission. The stored material can be read with conventional read out devices. One suitable device is the "Beam Addressable Memory" shown and described in U.S. Pat. No. 3,505,658 to G. Fan et al., commonly assigned. The description of such device is incorporated herein by reference.

More simply, the optical changes in the media may be probed with the same laser beam, wavelength of 6471 A, as had been employed to store information. When such laser beam is used to probe, it is found that transmission in the media decreases by a factor of 3 or more, which reflection increases by a similar factor. The reflectivity in the regions most easily written upon is about 20% before subjecting them to the laser beam and about 65% after.

OBJECT OF THE INVENTION

It is an object of this invention to provide a novel low threshold high density storage medium which is of relatively low cost as compared to known storage media utilized for the same purpose. It is another object of this invention to provide a storage medium in accordance with the preceding object which is efficaciously operated with a heating beam. And yet another object of this invention is to provide a novel read only storage medium consisting of adjacent thin layers of two or more materials which react upon heating, form a reaction product having properties different from the corresponding properties of said materials.

DESCRIPTION OF PREFERRED EMBODIMENTS

Figure 1:
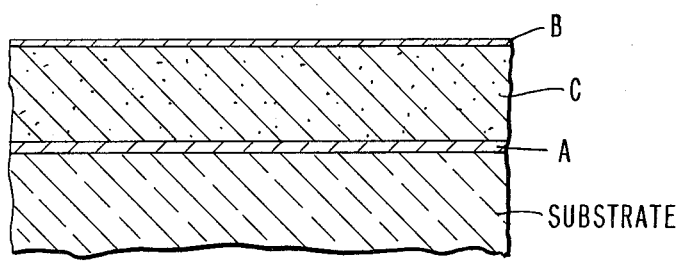
FIG. 1 is a fragmentary side view of a recording medium depicting layers of reactants intermediate a barrier layer and a substrate.

In accordance with the invention, the novel read-only storage medium provided herein consists of adjacent thin layers of two or more materials, respectively, which react, upon heating, to form a reaction product different from those of the reacting materials.

The reaction due to heating can be illustrated in the situation wherein a layer of an element such as selenium in a thickness of about 500A is deposited on a layer of aluminum, which had been exposed to air prior to the deposition, and which has a thickness of about 800 A, the aluminum lying on a suitable substrate such as Mylar or glass, for example. Because the aluminum prior to the deposition had been exposed to air, it had thereby been provided with an aluminum oxide coating.

When such aluminum-selenium combination is subjected to the radiation of a focused heating device such as a Xenon lamp, for example, from its selenium side, a reaction occurs between the aluminum and the selenium. The reaction, rather than occurring uniformly across the areas subjected to the lamp, initiates only at a multiplicity of discrete points. This phenomenon indicates that the aluminum oxide coating on the aluminum functions as a barrier to the reaction except at certain locations.

Further, when a sample of a selenium-aluminum combination, provided as described hereinabove, is heated at a rate of about 5°C/min beginning at room temperature while its optical density is concurrently monitored, an abrupt decrease in optical density occurs at 50°C. This occurrence indicates that the reaction occurs at the glass transition temperature of amorphous selenium thereby indicating that diffusion in the selenium layer is the rate limiting step. In this connection, it is to be noted that diffusion rates are known to increase discontinuously at the glass transition temperature of an amorphous phase of selenium or many other amorphous materials.

When a laser beam having a wavelength of about 6471A is directed onto selenium side of an aluminum-selenium combination as described above deposited on a Mylar film, such directing being in a region where the selenium is of an appropriate thickness, e.g. about 500A, to behave as a strong anti-reflecting film, the reaction is readily triggered with pulses with as low a repetition frequency as 100$\mu$sec and as low a minimum required energy as $0.75$ nj/$\mu$m$^2$ wherein $n$ = nano, $j$ = joules, and $\mu$ = microns. The appearance of the laser-beam-induced reaction, observed in white light, is a substantial enhancement in the reflectance, and the occurrence of a bluish spot in transmission. When the optical changes are measured by the same laser beam as had been used to produce the reaction, it is found that the transmission has decreased by a factor of at least three, while the reflection is commensurately increased by a similar factor. In this connection, the actual reflectivity in the region of the sample most readily written upon is about 20% before and about 65% after laser irradiation.

It was found that when a sample was utilized which comprised selenium deposited on an aluminum film on a Mylar substrate which had been overcoated with an acrylic polymer such as Polymethyl methacrylate, Polyethyl acrylate, poly-n-butyl methacrylate, polyisobutyl methacrylate, and the like, having a thickness of several thousand Angstroms, the selenium-aluminum reaction could be initiated with a focused Xenon lamp. However, in this situation, in contrast to the case of irradiation with the laser beam, the reaction occurred only at obvious breaks, pinholes and scratches in the acrylic coating.

When a structure is utilized which comprises alternate layers of selenium (about 500A), aluminum (about 300A) and selenium (about 500A) and which is prepared by alternating vacuum evaporations on a glass substrate without the breaking of the vacuum between evaporations, the resulting composite film has a relatively low optical transmittance and high reflectance in the as deposited condition. By locally heating the film, the aluminum and selenium react to form a transparent product $Al_2Se_3$. This reaction can be effected by the employment of a 100 $\mu$sec laser pulse of about 30 $nJ/\mu m^2$.

In accordance with the invention, the storage medium which is provided with layers comprising components A and B which undergo a reaction therebetween upon being subjected to heat and are separated by a barrier layer C. The barrier may suitably be the reaction product of A and B such as $Al_2Se_3$ when A and B are aluminum and selenium. It may also suitably be a compound of one of the reactants such as $Al_2O_3$, for example, where aluminum is either A or B, or it may be a material not having either A or B in its molecular structure but which functions to prevent A and B from reacting, an example of the latter material being a layer of a suitable polymer. The function of the barrier layer C is to prevent A and B from reacting spontaneously at ambient temperatures. The laser beam triggers the reaction between A and B by breaking down the barrier layer either by melting one of the reactants, thus mechanically disrupting the barrier layer, melting the barrier layer, or by substantially enhancing diffusion through the barrier layer. Advantageously, A and B may be chosen such that their reaction is exothermic whereby the heat of reaction at least partially offsets the heat input required to trigger the reaction, thereby lowering the threshold at which the reaction takes place.

In the embodiment of the storage medium, according to the invention, depicted in FIG. 1, layer A is the lower thermal conductivity reactant, e.g., Se, of reactants A and B, layer B is the absorbing reactant, e.g. of Al, and layer C is the barrier layer, e.g. $Al_2O_3$, $Al_2Se_3$, or a plastic material.

Figure 2:
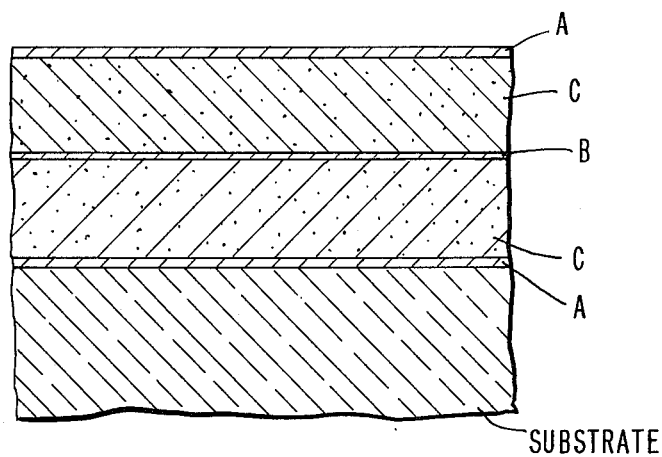
FIG. 2 is a fragmentary side view of a recording medium having double layers of one reactant and barrier layer with only one layer of another reactant.

In the embodiment of the storage medium depicted in FIG. 2, reactant A is chosen to be the lower thermal conductivity reactant, reactant B is chosen to be the absorbing reactant and layer C is the barrier layer. Further, in this embodiment, reactant A has a low thermal conductivity and a low absorption constant and reactant B has a high absorption constant. The configuration of the embodiment shown in FIG. 2 is advantageous in that it presents two surfaces of the layer of reactant B to react.

The reactants A and B are prepared in the form of fine powders by grinding, chemical precipitation or by vapor condensation. For example, aluminum powder with particles which will pass through a number 325 mesh U.S. Standard Seive Screen is prepared by condensation of Al vapor onto a cold finger. Selenium powder is prepared by chemical precipitation. The two powders are blended with an organic polymer solution. The semi-liquid phase mixture is spread onto a substrate by doctor blading. The reactants A and B can be co-evaporated in a vacuum on a substrate maintained at room temperature. The initial reaction of A and B forms a reaction product C which prevents further reaction of A and B.

Figure 3:
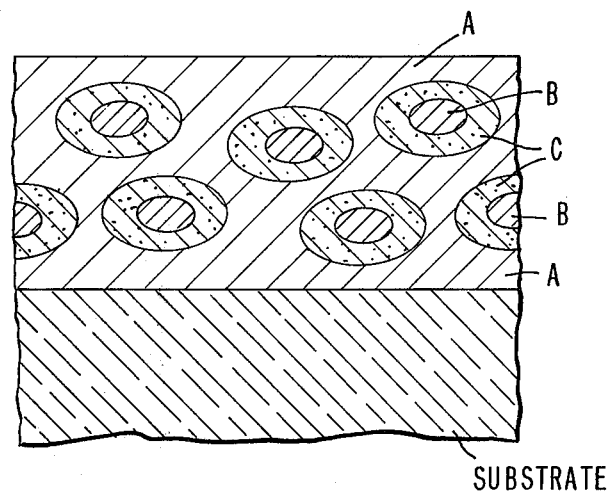
FIG. 3 is a fragmentary side view of a recording medium having the reactants dispersed in the barrier material.

In the embodiment shown in FIG. 3, the B reactant is dispersed in discrete bodies with a barrier layer of component C surrounding each body. The reactant A is the matrix in which the B bodies surrounded by the C layers are dispersed. The advantage presented by the embodiment depicted in FIG. 3 is that more surface area is presented for reaction.

The following tabulation sets forth combinations of reactants and suitable barrier layer materials, respectively, employable therewith, according to the invention.

| B Reactant | A Reactant | C Barrier | Reaction Product |
|---|---|---|---|
| Al | Se | $Al_2Se_3$ | $Al_2Se_3$ |
| Al | Se | $Al_2O_3$ | $Al_2Se_3$ |
| Al | Se | Acrylic Polymer | $Al_2Se_3$ |
| Zn | Se | ZnSe | ZnSe |
| Bi | Se | $Bi_2Se_3$ | $Bi_2Se_3$ |
| As | Se | $As_2Se_3$ | $As_2Se_3$ |
| Mn | Bi | MnBi | MnBi |
| In - Ga | As | $Ga_{1-x}In_xAs$ wherein x = 0 to 1 gr-atoms In | $Ga_{1-x}InAs$ |

While the invention has been particularly shown and described with reference to preferred embodiments thereof, it will be understood by those skilled in the art that materials having capabilities of undergoing relatively low energy chemical reaction to a reaction product having optical, magnetic or electrical properties different from the corresponding properties of the reactants can be used similarly to those materials disclosed, and that other changes in form and details may be made therein without departing from the spirit and scope of the invention.

What is claimed is:

1. A low threshold high density storage medium comprising adjacent thin layers of at least two materials which upon heating form a reaction product having optical, magnetic, or electrical properties different from the corresponding properties of said materials respectively said at least two materials being selected from the group consisting of Al, Se, Zn, Bi, As, Mn and In - Ga; and including a thin barrier layer intermediate said at least two material layers and comprising a substance different from said materials for preventing the spontaneous reaction of said materials in the absence of said heating; and wherein one of said at least two materials is intermediate double layers of said other material layers and said barrier layer.

* * * * *